United States Patent
Mizuno et al.

(10) Patent No.: US 9,941,167 B2
(45) Date of Patent: Apr. 10, 2018

(54) METHOD FOR MANUFACTURING ELEMENT CHIP

(71) Applicant: Panasonic Intellectual Property Management Co., Ltd., Osaka (JP)

(72) Inventors: Bunzi Mizuno, Nara (JP); Shogo Okita, Hyogo (JP); Mitsuru Hiroshima, Osaka (JP); Tutomu Sakurai, Nara (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/426,199

(22) Filed: Feb. 7, 2017

(65) Prior Publication Data
US 2017/0263500 A1    Sep. 14, 2017

(30) Foreign Application Priority Data

Mar. 11, 2016 (JP) ................................. 2016-048002

(51) Int. Cl.
| H01L 21/00 | (2006.01) |
| H01L 21/78 | (2006.01) |
| H01L 21/67 | (2006.01) |
| H01L 21/683 | (2006.01) |
| H01L 21/268 | (2006.01) |
| H01L 21/3065 | (2006.01) |

(52) U.S. Cl.
CPC ........ *H01L 21/78* (2013.01); *H01L 21/67069* (2013.01); *H01L 21/67109* (2013.01); *H01L 21/67115* (2013.01); *H01L 21/6831* (2013.01); *H01L 21/268* (2013.01); *H01L 21/3065* (2013.01)

(58) Field of Classification Search
CPC ........ H01L 21/3065; H05K 2201/0166; H05K 3/0041
See application file for complete search history.

(56) References Cited

U.S. PATENT DOCUMENTS

| 8,975,163 B1* | 3/2015 | Lei ......................... H01L 21/78 257/E21.602 |
| 9,142,459 B1* | 9/2015 | Kumar ................ H01L 21/0337 |
| 2011/0312157 A1 | 12/2011 | Lei |

FOREIGN PATENT DOCUMENTS

JP    2013-535114 A    9/2013

* cited by examiner

*Primary Examiner* — Jaehwan Oh
*Assistant Examiner* — Andre' C Stevenson
(74) *Attorney, Agent, or Firm* — Pearne & Gordon LLP (57) ABSTRACT

The method includes a laser scribing step of forming an opening including an exposing portion, where the first layer is exposed, by irradiating the dividing region of the substrate with laser light from the first main surface side, forming a remaining region on which the second layer in the dividing region remains around the opening other than the exposing portion, and forming a first damaged region of a surface layer portion of the first layer including the exposing portion and a second damaged region of a surface layer portion of the first layer to be covered by the remaining region on the first layer of the dividing region.

6 Claims, 5 Drawing Sheets

METHOD FOR MANUFACTURING ELEMENT CHIP

BACKGROUND

1. Technical Field

The present disclosure relates to a method for manufacturing an element chip including a laser scribing step.

2. Description of the Related Art

Figure 5A:
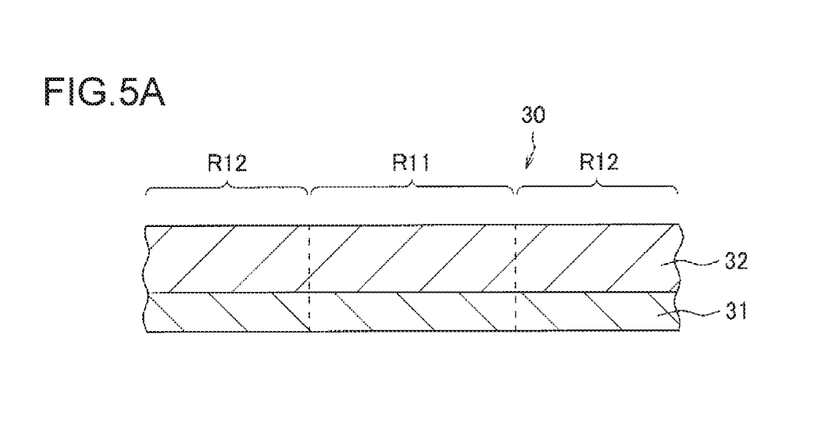
FIG. 5A is a cross-sectional view illustrating a step of a manufacturing method of an element chip in the related art.
Figure 5B:
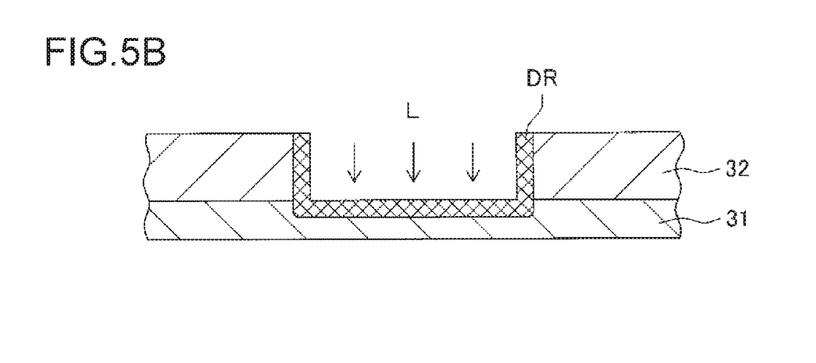
FIG. 5B is a cross-sectional view illustrating a step of the manufacturing method of an element chip in the related art.
Figure 5C:
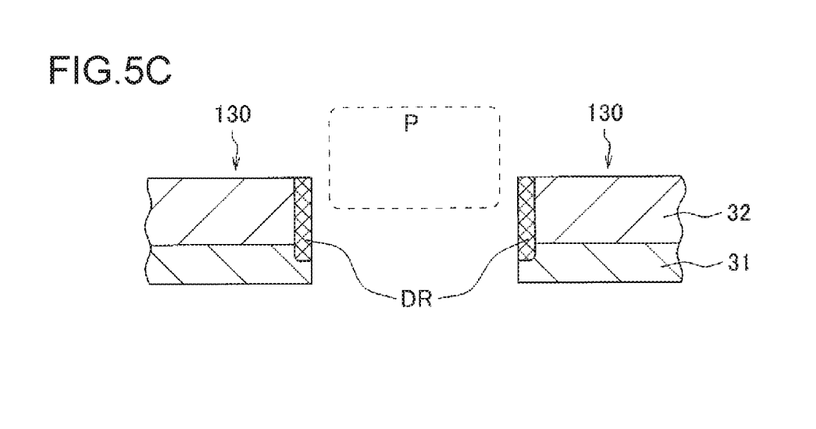
FIG. 5C is a cross-sectional view illustrating a step of the manufacturing method of an element chip in the related art.

An element chip is manufactured by dicing substrate 30 including first layer 31 that is a semiconductor layer and second layer 32 including an insulating film as illustrated in FIGS. 5A to 5C. Substrate 30 includes dividing region R11 for dividing substrate 30 and a plurality of element regions R12 to be defined by dividing region R11 (FIG. 5A). By removing dividing region R11 of substrate 30, substrate 30 is diced and a plurality of element chips 130 are formed. PTL 1 discloses that substrate 30 is diced through etching with plasma P (FIG. 5C) after scribing dividing region R11 with laser light L (FIG. 5B).

CITATION LIST

Patent Literature

PTL 1: Japanese Patent Unexamined Publication (Translation of PCT Application) No. 2013-535114

SUMMARY

In the laser scribing step (FIG. 5B), generally, damaged region DR is formed on substrate 30 due to thermal influence. Damaged region DR is formed to be wider than dividing region R11 irradiated with laser light by heat propagation. Therefore, damaged region DR remains on element region R12, that is, an end surface of diced element chip 130, even if dividing region R11 is removed through the plasma etching (FIG. 5C). In a case of crystal disorder or polycrystalline, coarsening of crystal grains is observed in damaged region DR. Therefore, in particular, damaged region DR remaining in first layer 31 tends to be a starting poring for cleavage of first layer 31, and the cleavage may cause element chip 130 to be damaged. That is, in this method, deflective strength of element chip 130 is easily reduced.

An aspect of the present disclosure relates to a method for manufacturing an element chip including a step of preparing a substrate, a laser scribing step, an exposing step after the laser scribing step, and a plasma dicing step after the exposing step, and has the following features. That is, the step of preparing the substrate is a step of preparing a substrate which has a first main surface and a second main surface and includes a first layer that is a semiconductor layer, a second layer including an insulating film formed on a side of the first main surface of the first layer, a plurality of element regions, and a dividing region for defining each of the element regions. The laser scribing step is a step of forming an opening including an exposing portion where the first layer is exposed at the dividing region by irradiating the dividing region with laser light from the side of the first main surface, forming a remaining region on which the second layer in the dividing region remains around the opening other than the exposing portion, and forming, on the first layer of the dividing region, a first damaged region of a surface layer portion of the first layer including the exposing portion and a second damaged region of the surface layer portion of the first layer to be covered by the remaining region. The exposing step is a step of exposing the second damaged region by etching at least the remaining region covering the second damaged region after laser scribing step. The plasma dicing step is a step of dividing the substrate into a plurality of element chips including the element regions through etching the first layer along with the first damaged region and the second damaged region by exposing the opening to first plasma in a state where the second main surface is supported by a supporting member, after the exposing step.

According to the present disclosure, since the starting point of cleavage is reduced, deflective strength of an element chip is improved.

DETAILED DESCRIPTION

In the present exemplary embodiment, a substrate is diced by a method which does not remain a damaged region due to laser light on a diced element chip. That is, a step of preparing a substrate which has a first main surface and a second main surface and includes a first layer that is a semiconductor layer, a second layer including an insulating film formed on the first main surface side of the first layer, a plurality of element regions, and a dividing region for defining the element region is included. A laser scribing step of forming an opening including an exposing portion where the first layer is exposed at the dividing region by irradiating the dividing region with laser light from the first main surface side, forming a remaining region on which the second layer in the dividing region remains around the opening other than the exposing portion, and forming a first damaged region of a surface layer portion of the first layer including the exposing portion and a second damaged region of a surface layer portion of the first layer to be covered by the remaining region on the first layer of the dividing region is included. An exposing step of exposing the second damaged region by etching at least the remaining region covering the second damaged region after laser scribing step is included. a plasma dicing step of dividing the substrate into a plurality of element chips including the element region through etching the first layer along with the first damaged region and the second damaged region by exposing the opening to first plasma in a state where the second main surface is supported by a supporting member, after the exposing step is included. The element chip is manufactured by these methods.

The manufacturing method according to the present exemplary embodiment will be described with reference to FIGS. 1A to 1D and 2A and 2B. FIGS. 1A to 1D are cross-sectional views illustrating the manufacturing method according to an exemplary embodiment. FIG. 2A is an enlarged cross-sectional view illustrating a main portion of FIG. 1B and FIG. 2B is an enlarged cross-sectional view illustrating a main portion of FIG. 1B.

(1) Preparing Step

Figure 1A:
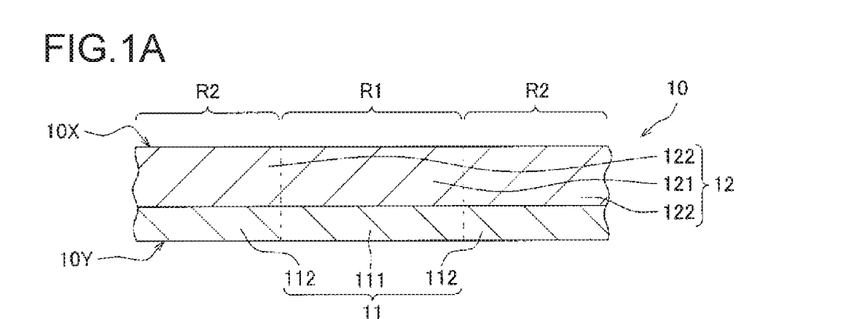
FIG. 1A is a cross-sectional view illustrating a step of a manufacturing method according to an exemplary embodiment of the present disclosure.
Figure 1B:
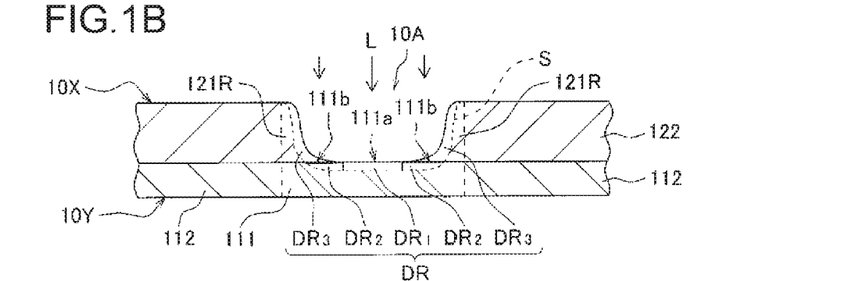
FIG. 1B is a cross-sectional view illustrating a step of a manufacturing method according to the exemplary embodiment of the present disclosure.
Figure 2A:
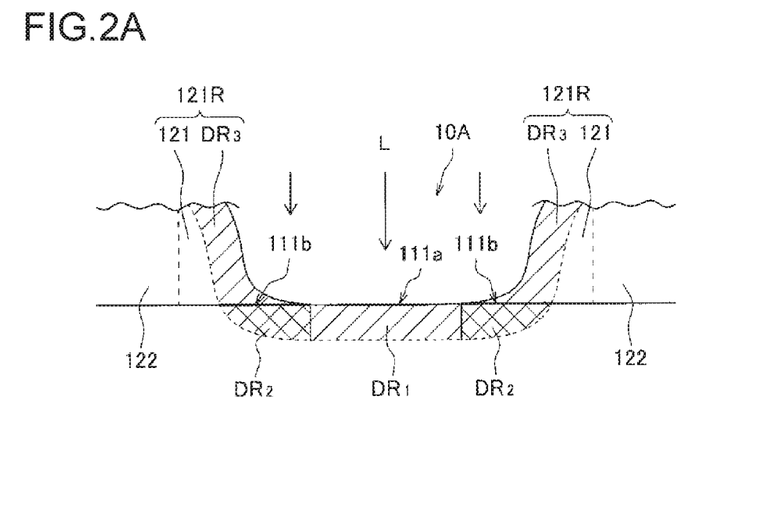
FIG. 2A is an enlarged cross-sectional view illustrating a boundary portion between a first layer and a second layer in FIG. 1B.
Figure 2B:
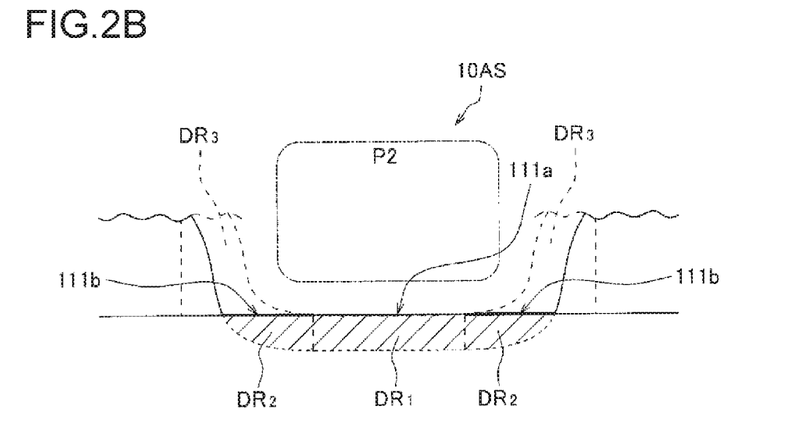
FIG. 2B is an enlarged cross-sectional view illustrating a boundary portion between a first layer and a second layer in FIG. 1C.

Firstly, substrate 10 to be diced is prepared (FIG. 1A). Substrate 10 has first main surface 10X and second main surface 10Y and includes first layer 11 that is a semiconductor layer and second layer 12 including an insulating layer which is formed on first main surface 10X side of first layer 11. In addition, substrate 10 is separated into dividing region R1 and the plurality of element regions R2 which are defined by dividing region R1. Accordingly, first layer 11 includes first dividing region 111 corresponding to dividing region R1 and a plurality of first element regions 112 corresponding to element regions R2. Second layer 12 includes a second dividing region 121 corresponding to dividing region R1 and a plurality of second element regions 122 corresponding to element regions R2. A semiconductor circuit, an electric component element, and a circuit layer such as MEMS (which are not illustrated) may be formed on element regions R2 of substrate 10 (first element region 112 and second element region 122).

First layer 11 is a semiconductor layer formed of, for example, silicon (Si), gallium arsenide (GaAs), gallium nitride (GaN), silicon carbide (SiC), or the like. Second layer 12 includes at least an insulating film. For example, the insulating layer includes silicon dioxide ($SiO_2$), silicon nitride ($Si_3N_4$), lithium tantalate ($LiTaO_3$), lithium niobate ($LiNbO_3$), or the like. Second layer 12 may include a multilayer wiring layer (for example, a laminate of a low-k (low dielectric constant) and a copper (Cu) wiring layer), a metal material, a resin protective layer (for example, polyimide), a resist, or the like addition to the insulating film.

(2) Laser Scribing Step

In the laser scribing step, a part of second dividing region 121 is removed by irradiating second dividing region 121 with laser light L from first main surface 10X side to form opening 10A in which a part of first dividing region 111 is exposed (FIG. 1B and FIG. 2A). In other words, in the laser scribing step, exposing portion 111a is formed by exposing a part of first dividing region 111.

In this time, a part of second dividing region 121 remains around opening 10A other than exposing portion 111a without removing entire second dividing region 121. Second dividing region 121 remaining around opening 10A (hereinafter, referred to as remaining region 121R) covers a part of a front surface of first main surface 10X side of first dividing region 111. Hereinafter, a part of the front surface of first dividing region 111 which is covered by remaining region 121R is referred to as a covering portion 111b. For example, covering portion 111b is formed so as to sandwich and surround exposing portion 111a.

The method for forming remaining region 121R around opening 10A is not particularly limited. For example, a method for forming opening 10A in a tapered shape narrowing from first main surface 10X toward second main surface 10Y is included. In this case, when viewing the cross-section of opening 10A, remaining region 121R has a shape that draws a peak toward exposing portion 111a in the vicinity of a boundary between second dividing region 121 and first dividing region 111. Therefore, covering portion 111b is easily formed.

For example, opening 10A having a tapered shape can be formed by controlling a beam profile (the shape of a beam) of laser light L. For example, the beam profile of laser light L is controlled such that light intensity to the end portion of second dividing region 121 becomes smaller than that of a center of second dividing region 121. Accordingly, it is difficult to scribe the end portion of second dividing region 121, remaining region 121R is formed around opening 10A by removing exposing portion 111a. The distribution of laser light L is not particularly limited. The ratio of the light intensity of the end portion of second dividing region 121 to the center of second dividing region 121 is, for example, within a range of 0.1 to 0.5 inclusive. The control of the beam profile may be performed by using, for example, an optical element such as an optical lens. A center wavelength of laser light L is not particularly limited, and is within a range of 350 to 600 nm inclusive, for example.

By the irradiation with laser light L, damaged region DR which is thermally affected by laser light L is formed around opening 10A. Therefore, first damaged region DR1 is formed below exposing portion 111a and second damaged region DR2 is formed below covering portion 111b. Remaining region 121R also includes third damaged region DR3. In FIG. 1B, boundary surface S between damaged region DR and the other regions is indicated by a broken line. The thicknesses of first damaged regions DR1, DR2, and DR3 is changed depending on a radiation condition of laser light L or a material of a portion to be irradiated with laser light L, and are about 0.1 to 10 μm, for example.

(3) Exposing Step

Figure 1C:
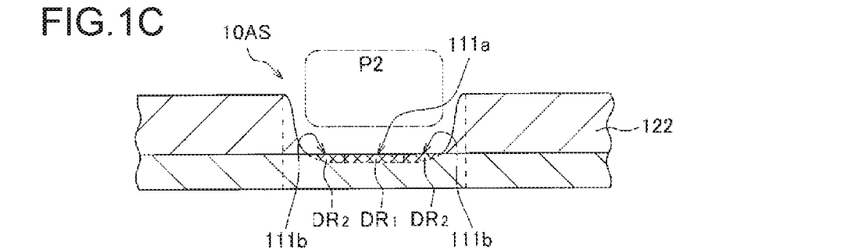
FIG. 1C is a cross-sectional view illustrating a step of a manufacturing method according to the exemplary embodiment of the present disclosure.

After the laser scribing step and before the plasma dicing step, second damaged region DR2 is exposed by etching at least remaining region 121R covering portion 111b (FIGS. 1C and 2B). Accordingly, the front surface (exposing portion 111a) of first damaged region DR1 and the front surface (covering portion 111b) of second damaged region DR2 are exposed from opening 10A. Therefore, in a plasma dicing step to be performed later, second damaged region DR2 is etched in addition to first damaged region DR1.

The method of etching in the exposing step is not particularly limited, the method may be a dry etching method such as plasma etching or a wet etching method. Among these methods, when considering that the plasma dicing is performed in a post-process, from the viewpoint of productivity, etching by the plasma is preferable. In this case, the etching is performed so as to expand the width of opening 10A and opening 10AS expanded rather than opening 10A is formed. In addition, almost all of third damaged region DR3 can be etched. From the viewpoint of handling property, the exposing step using the plasma etching is preferably performed in a state where second main surface 10Y is supported by supporting member 22 (refer to FIG. 1D).

Figure 3A:
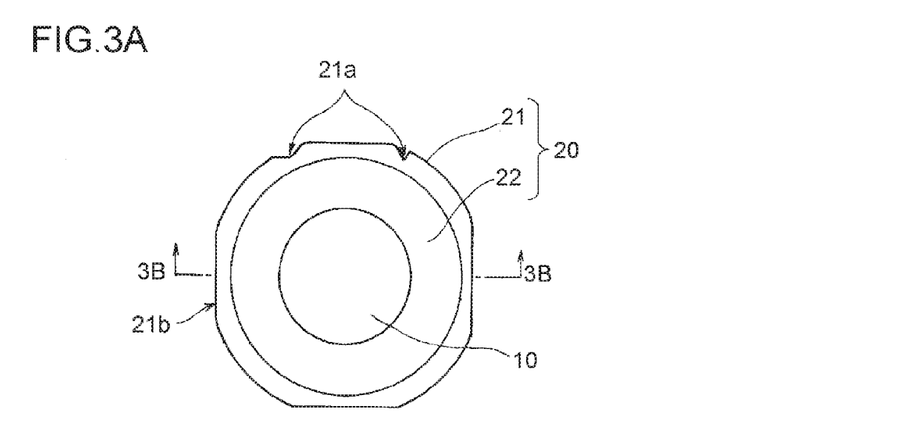
FIG. 3A is a top surface illustrating a transfer carrier.
Figure 3B:
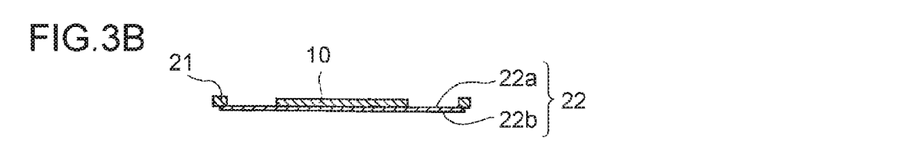
FIG. 3B is a cross-sectional view taken along line 3B-3B of FIG. 3A illustrating the transfer carrier.

The material of supporting member 22 is not particularly limited. Among the materials, when considering that substrate 10 is diced in a state where substrate 10 is supported by supporting member 22, from the viewpoint that element chip 110 to be obtained is easily picked up, supporting member 22 is preferably a flexible resin film. In this case, from the viewpoint of handling property, supporting member 22 is fixed to frame 21 as illustrated in FIGS. 3A and 3B. Hereinafter, frame 21 and supporting member 22 which is fixed to frame 21 are collectively referred to as transfer carrier 20. FIG. 3A is a top surface view illustrating transfer carrier 20 and FIG. 3B is a cross-sectional view taken along line 3B-3B of FIG. 3A illustrating transfer carrier 20.

The material of the resin film is not particularly limited, and examples thereof include a thermoplastic resin such as polyolefins such as polyethylene and polypropylene and polyester such as polyethylene terephthalate. Various additives such as a rubber component (for example, ethylene-propylene rubber (EPM), ethylene-propylene-diene rubber (EPDM), or the like) for applying stretchability, a plasticizer, a softener, an antioxidant, a conductive material, and the like may be blended to the resin film. In addition, the thermoplastic resin may have a functional group that exhibits a photopolymerization reaction such as an acrylic group.

For example, supporting member 22 includes a surface having an adhesive (adhesive surface 22a) and a surface having no adhesive (non-adhesive surface 22b). The outer peripheral edge of adhesive surface 22a is adhered to one surface of frame 21 and covers the opening of frame 21. The substrate 10 is adhered and held on a portion which is exposed from the opening of frame 21 of adhesive surface 22a. When the plasma process is performed, supporting member 22 is mounted on the stage such that the stage to be disposed within the plasma processing device is in contact with non-adhesive surface 22b.

Adhesive surface 22a is preferably formed of the adhesive component in which the adhesive force is reduced by irradiation with an ultraviolet lay (UV). Accordingly, when element chip 110 is picked up after the plasma dicing, element chip 110 is easily peeled off from adhesive surface 22a by performing UV irradiation, element chip 110 is easily picked up. For example, supporting member 22 is obtained by applying a UV curable acrylic adhesive on one surface of a resin film in a thickness of 5 to 20 μm.

Frame 21 is a frame body having an opening with an area equal to or larger than the entire area of semiconductor substrate 10 and has a predetermined width and a substantially constant thin thickness. Frame 21 has the rigidity to extent that holding sheet 22 and semiconductor substrate 10 can be transported in a state where supporting member 22 and semiconductor substrate 10 are held. The shape of the opening of frame 21 is not particularly limited. However, the shape thereof may be a polygon such as a circle, a rectangle, a hexagon, or the like. Notch 21a or corner cut 21b for positioning may be provided in frame 21. Examples of the material of frame 21 include metals such as aluminum and stainless steel, a resin, or the like.

Figure 4:
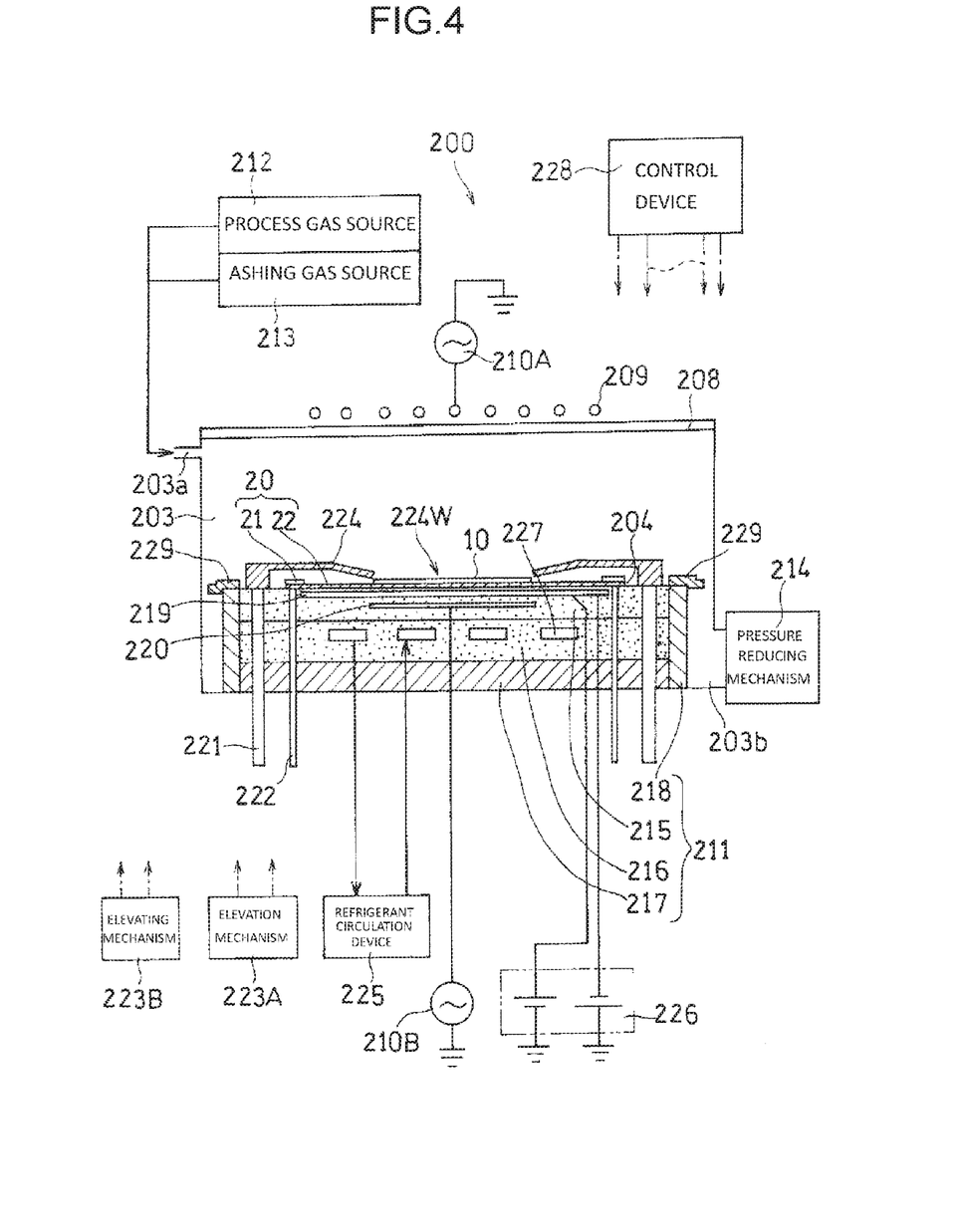
FIG. 4 is a conceptual diagram illustrating a schematic structure of a plasma processing device in a cross section.

Next, plasma processing device 200 to be used in the plasma etching and the plasma dicing steps will be described in detail with reference to FIG. 4. However, the plasma processing device is not limited thereto. FIG. 4 illustrates a structure of plasma processing device 200 to be used in the present exemplary embodiment, in a cross-section.

Plasma processing device 200 includes stage 211. Transfer carrier 20 is mounted on stage 211 such that the surface, on which semiconductor substrate 10 of supporting member 22 is held, faces upward. Cover 224 having window portion 224W for covering at least a part of frame 21 and supporting member 22 and for exposing at least a part of substrate 10 is disposed above stage 211.

Stage 211 and cover 224 are disposed inside the reaction chamber (vacuum chamber 203). Vacuum chamber 203 has a roughly cylindrical shape with an upper portion opened and the upper opening is closed by dielectric member 208 that is a lid. As a material configuring vacuum chamber 203, aluminum, stainless steel (SUS), aluminum in which the surface is alumite-processed, and the like can be exemplified. As the material configuring dielectric member 208, a dielectric material such as yttrium oxide ($Y_2O_3$), aluminum nitride (AlN), alumina ($Al_2O_3$), quartz ($SiO_2$), and the like can be exemplified. Antenna 209 as an upper electrode is disposed above dielectric member 208. Antenna 209 is electrically connected to first high frequency power supply 210A. Stage 211 is disposed at the bottom portion side inside vacuum chamber 203.

Gas feed port 203a is connected to vacuum chamber 203. Process gas source 212 and aching gas source 213 that are a supply source of the process gas is connected to gas feed port 203a respectively, by pipes. In addition, exhaust port 203b is provided on vacuum chamber 203, and pressure reducing mechanism 214 including a vacuum pump for evacuating the gas in vacuum chamber 203 and decompressing the gas is connected to exhaust port 203b.

Stage 211 includes electrode layer 215, metal layer 216, base 217 for supporting, electrode layer 215 and metal layer 216, and outer peripheral portion 218 surrounding electrode layer 215, metal layer 216, and base 217 which have substantially circular shape. Outer peripheral portion 218 is configured of the metal layer with conductivity and etching resistance, and protects electrode layer 215, metal layer 216, and base 217 from the plasma. Annular outer peripheral ring 229 is disposed on the upper surface of outer peripheral portion 218. Outer peripheral ring 229 serves to protect the upper surface of outer peripheral portion 218 from the plasma. Electrode layer 215 and outer peripheral ring 229 are configured of, for example, the above-described dielectric material.

An electrode portion (hereinafter, referred to as an ESC electrode 219) for configuring electrostatic suction mechanism and high frequency electrode portion 220 which is electrically connected to second high frequency power surface 210B are disposed inside electrode layer 215. Direct-current power supply 226 is electrically connected to ESC electrode 219. The electrostatic suction mechanism is configured of ESC electrode 219 and direct-current power supply 226.

Metal layer 216 is configured of, for example, aluminum in which an alumite coating is formed on the surface thereof. Coolant flow path 227 is formed in metal layer 216. Coolant flow path 227 cools stage 211. By cooling stage 211, supporting member 22 mounted on stage 211 is cooled and cover 224 in which a part thereof is in contact with stage 211 is also cooled. Accordingly, substrate 10 or supporting member 22 is suppressed from being damaged by being heated during plasma processing. The coolant in coolant flow path 227 is circulated by refrigerant circulation device 225.

A plurality of supporting portions 222 passing through stage 211 is disposed in the vicinity of stage 211. Supporting portion 222 is driven to move up and down by elevation mechanism 223A. When transfer carrier 20 is transported into vacuum chamber 203, transfer carrier 20 is transferred to supporting portion 222 which is raised to a predetermined position. Supporting portion 222 supports frame 21 of transfer carrier 20. The upper end surface of supporting member 22 descends to the same level as stage 211. Accordingly, transfer carrier 20 is mounted on a predetermined position of stage 211.

A plurality of elevating rods 221 are connected to the end portion of cover 224, thereby capable of elevating cover 224. Elevating rod 221 is driven to move up and down by elevating mechanism 223B. The elevating operation of cover 224 by elevating mechanism 223B can be performed independently of elevation mechanism 223A.

Control device 228 controls an operation of an element for configuring plasma processing device 200 including first high frequency power supply 210A, second high frequency power surface 210B, process gas source 212, ashing gas source 213, pressure reducing mechanism 214, refrigerant circulation device 225, elevation mechanism 223A, elevating mechanism 223B, and the electrostatic suction mechanism.

In the exposing step, a plasma process is performed under the condition that a part of remaining region 121R is etched. The etching may be performed using a physical action of the plasma and may be performed using a chemical action. Since remaining region 121R includes the insulating film, it is preferable that the etching is performed using a chemical action of plasma P2 which uses a process gas including fluorocarbon such as $CF_4$ as a raw material.

Plasma P2 can be generated under the conditions that the pressure in vacuum chamber 203 is adjusted to 0.2 to 15 Pa, power to be inputted from first high frequency power supply 210A to antenna 209 is set to 1500 to 2500 W, and power to be inputted from second high frequency power surface 210B to high frequency electrode portion 220 is set to 150 to 300 W, while supplying 150 to 250 sccm of $CF_4$ as a raw material, for example. The sccm is a unit of a flow rate and 1 sccm is an amount of the gas in a standard state (0° C., 1 atmosphere) flowing 1 cm$^3$ per a minute.

In a case where remaining region 121R further includes a metal material, it is preferable to perform the etching by the physical action of plasma P3 which uses a process gas including argon (Ar) as a raw material. Plasma P3 can be generated under the conditions that the pressure in vacuum chamber 203 is adjusted to 0.2 to 1.5 Pa, power to be inputted from first high frequency power supply 210A to antenna 209 is set to 1500 to 2500 W, and power to be inputted from second high frequency power surface 210B to high frequency electrode portion 220 is set to 150 to 300 W, while supplying 150 to 250 sccm of a mixed gas of $CF_4$ and Ar ($CF_4$:Ar=50:50 (volume ratio)) as a raw material.

In a case where remaining region 121R includes an organic material such as a resist, etching may be performed by a chemical action of plasma P4 which uses a process gas containing oxygen ($O_2$) as a raw material. Plasma P4 can be generated under the conditions that the pressure in vacuum chamber 203 is adjusted to 5 to 15 Pa, power to be inputted from first high frequency power supply 210A to antenna 209 is set to 1500 to 2500 W, and power to be inputted from second high frequency power surface 210B to high frequency electrode portion 220 is set to 0 to 200 W, while supplying 150 to 300 sccm of a mixed gas of $CF_4$ and $O_2$ ($CF_4$:$O_2$=50:50 (volume ratio)) as a raw material.

In the generation of each plasma, a plurality of types of process gases may be used in a combination manner. In this case, a plurality types of process gases may be introduced into vacuum chamber 203 with a time difference, and a plurality types of process gases may be mixed and introduced into vacuum chamber 203. Among them, in the viewpoint of effectively removing the insulating film, etching is preferably performed with plasma P2.

In a case where remaining region 121R includes a metal material, the etching with plasma P3 is preferable performed while applying the high frequency power to high frequency electrode portion 220 and applying a bias voltage thereto. Accordingly, remaining region 121R is further removed efficiently. FIGS. 1C and 2C illustrate a case where etching is performed with plasma P2.

(3) Plasma Dicing Step

Figure 1D:
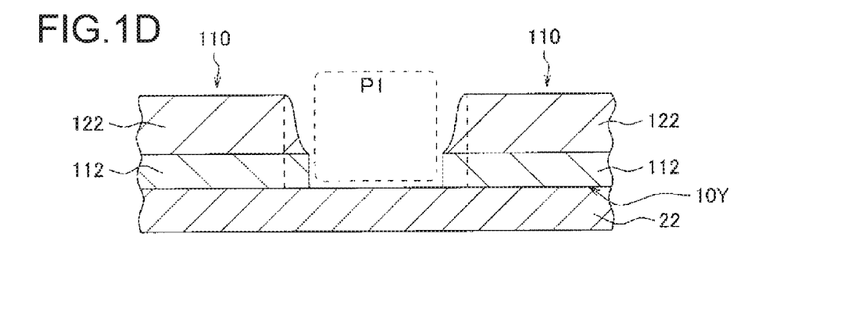
FIG. 1D is a cross-sectional view illustrating a step of a manufacturing method according to the exemplary embodiment of the present disclosure.

Next, substrate 10 is exposed to plasma P1 in a state where second main surface 10Y is supported by supporting member 22. Plasma P1 is generated under the condition in which first dividing region 111 is etched. The above-described etching condition can be appropriately selected depending on the material of first layer 11. In a case where first layer 11 includes Si, a so-called Bosch process can be used for etching first dividing region 111. In the Bosch process, a stacked film stacking step, a stacked film etching step, and a Si etching step are sequentially repeated to dig first dividing region 111 in the depth direction.

For example, the stacked film stacking step is performed under the conditions that the pressure in vacuum chamber 203 is adjusted to 15 to 25 Pa, power to be inputted from first high frequency power supply 210A to antenna 209 is set to 1500 to 2500 W, power to be inputted from second high frequency power surface 210B to high frequency electrode portion 220 is set to 0 W, and the process is performed for 5 to 15 seconds, while supplying 150 to 250 sccm of $C_4F_8$ as a raw material.

For example, the stacked film etching step is performed under the conditions that the pressure in vacuum chamber 203 is adjusted to 5 to 15 Pa, power to be inputted from first high frequency power supply 210A to antenna 209 is set to 1500 to 2500 W, power to be inputted from second high frequency power surface 210B to high frequency electrode portion 220 is set to 100 to 300 W, and the process is performed for 2 to 10 seconds, while supplying 200 to 400 sccm of $SF_6$ as a raw material.

For example, the Si etching step is performed under the conditions that the pressure in vacuum chamber 203 is adjusted to 5 to 15 Pa, power to be inputted from first high frequency power supply 210A to antenna 209 is set to 1500 to 2500 W, power to be inputted from second high frequency power surface 210B to high frequency electrode portion 220 is set to 50 to 200 W, and the process is performed for 10 to 20 seconds, while supplying 200 to 400 sccm of $SF_6$ as a raw material.

Under the above conditions, the stacked film stacking step, the stacked film etching step, and the Si etching step are sequentially repeated to subject etching to first dividing region 111 in the depth direction at a rate of 10 μm/min.

In this case, second element region 122 serves as the mask. Therefore, in the plasma dicing step, among first layer 11, first damaged region DR1 and second damaged region DR2 which are formed thereunder, and first dividing region 111 are etched using exposing portion 111a and covering portion 111b which is exposed in the exposing step as starting points. Accordingly, substrate 10 is diced into a plurality of element chip 110 including element regions R2. That is, damaged region DR as the starting point of cleavage does not remain on the end surface of element chip 110 to be obtained, in particular, first layer 11 (first element region 112). Therefore, when element chip 110 is used, element chip 110 is suppressed from being damaged, even when external force (bending, impact, or the like) is applied. In addition, in the present exemplary embodiment, substrate 10 is diced in a state where substrate 10 is suppressed by supporting member 22. Therefore, after dicing, element chip 110 to be obtained is picked up while peeling off from supporting member 22. Also in this case, since damaged region DR does not remain on the end surface of element chip 110, element chip 110 is picked up without being damaged.

According to the method according to the present disclosure, since the element chip with excellent deflective strength is obtained, the method is useful as a method for manufacturing the element chip from various substrates.

What is claimed is:

1. A method for manufacturing an element chip, comprising: a step of preparing a substrate which has a first main surface and a second main surface and includes a first layer that is a semiconductor layer, a second layer including an insulating film formed on a side of the first main surface of the first layer, a plurality of element regions, and a dividing region for defining each of the element regions; a laser scribing step of forming an opening including an exposing portion where the first layer is exposed at the dividing region by irradiating the dividing region with laser light from the side of the first main surface, wherein during forming the opening, a part of the second layer remains in the dividing region around the opening to form a remaining region a surface layer portion of the first layer exposed in the opening is damaged to form a first damaged region, and a surface layer portion of the first layer covered by the remaining region is damaged to form a second damaged region; an exposing step of exposing the second damaged region by etching at least the remaining region covering the second damaged region after laser scribing step; and a plasma dicing step of dividing the substrate into a plurality of element chips including each of the element regions through etching the first layer along with the first damaged region and the second damaged region by exposing the opening to first plasma in a state where the second main surface is supported by a supporting member, after the exposing step; wherein in the laser scribing step, the opening is formed in a tapered shape from the first main surface to a surface of the second damaged region, and wherein in the plasma dicing step, the first layer is etched vertically in a depth direction of the first layer.

2. The method of claim 1,
wherein in the exposing step, the remaining region is etched with second plasma which uses a process gas containing fluorocarbon as a raw material.

3. The method of claim 1,
wherein in the exposing step, the remaining region is etched with third plasma which uses a process gas containing argon as the raw material while applying high frequency power to a plasma processing stage on which the substrate is mounted.

4. A method for manufacturing an element chip, comprising: a step of preparing a substrate which has a first main surface and a second main surface and includes a first layer that is a semiconductor layer, a second layer including an insulating film formed on a side of the first main surface of the first layer, a plurality of element regions, and a dividing region for defining each of the element regions; a laser scribing step of forming an opening including an exposing portion where the first layer is exposed at the dividing region by irradiating the dividing region with laser light from the side of the first main surface, wherein during dividing region around the opening to form a remaining region, a surface layer portion of the first layer exposed in the opening is damaged to form a first damaged region, and a surface layer portion of the first layer covered by the remaining region is damaged to form a second damaged region; an exposing step of exposing the second damaged region by etching at least the remaining region covering the second damaged region after laser scribing step; and a plasma dicing step of dividing the substrate into a plurality of element chips including each of the element regions through etching the first layer along with the first damaged region and the second damaged region by exposing the opening to first plasma in a state where the second main surface is supported by a supporting member, after the exposing step, wherein in the exposing step, the remaining region is etched with second plasma which uses a process gas containing fluorocarbon as a raw material.

5. The method of claim 4,
wherein in the laser scribing step, the opening is formed in a tapered shape narrowing from the first main surface to a surface of the second damaged region.

6. The method of claim 4,
wherein the insulating film includes silicon dioxide or silicon nitride.

* * * * *

UNITED STATES PATENT AND TRADEMARK OFFICE
CERTIFICATE OF CORRECTION

PATENT NO. : 9,941,167 B2
APPLICATION NO. : 15/426199
DATED : April 10, 2018
INVENTOR(S) : Bunzi Mizuno et al.

It is certified that error appears in the above-identified patent and that said Letters Patent is hereby corrected as shown below:

In the Claims

Column 9, Line 23, in Claim 1 "a remaining region a" should read --a remaining region, a--

Column 9, Line 36, in Claim 1 "after the exposing step;" should read --after the exposing step,--

Column 10, Line 17, in Claim 4 "wherein during dividing region" should read --wherein during forming the opening, a part of the second layer remains in the dividing region--

Signed and Sealed this
Twenty-second Day of May, 2018

Andrei Iancu
*Director of the United States Patent and Trademark Office*